(12) United States Patent
Petermann (10) Patent No.: US 10,156,588 B2
(45) Date of Patent: Dec. 18, 2018

(54) CONTACT TIP AND CONTACT ELEMENT AND METHOD OF PRODUCING THE SAME

(71) Applicant: Multitest elektronische Systeme GmbH, Rosenheim (DE)

(72) Inventor: Manuel Petermann, Rosenheim (DE)

(73) Assignee: Multitest Elektronische Systeme GmbH, Rosenheim (DE)

( * ) Notice: Subject to any disclaimer, the term of this patent is extended or adjusted under 35 U.S.C. 154(b) by 762 days.

(21) Appl. No.: 14/593,958

(22) Filed: Jan. 9, 2015

(65) Prior Publication Data

US 2015/0192612 A1    Jul. 9, 2015

(30) Foreign Application Priority Data

Jan. 9, 2014   (EP) .................................... 14150596

(51) Int. Cl.
   *G01R 3/00*   (2006.01)
   *H01R 43/16*  (2006.01)
   *G01R 1/067*  (2006.01)

(52) U.S. Cl.
   CPC ........... *G01R 3/00* (2013.01); *G01R 1/06761* (2013.01); *H01R 43/16* (2013.01); *Y10T 83/04* (2015.04)

(58) Field of Classification Search
   CPC ........ G01R 3/00; G01R 1/06761; Y10T 83/04
   See application file for complete search history.

(56) References Cited

U.S. PATENT DOCUMENTS

| | | |
|---|---|---|
| 3,882,597 A | 5/1975 | Chayka et al. |
| 2002/0047721 A1 | 4/2002 | Mikami |
| 2003/0052703 A1* | 3/2003 | Terada .................. G01R 1/067 324/756.03 |
| 2008/0001612 A1 | 1/2008 | Kister |
| 2008/0036479 A1 | 2/2008 | Okumura et al. |
| 2008/0074128 A1 | 3/2008 | Hirakawa |
| 2013/0222005 A1 | 8/2013 | Hirano et al. |

OTHER PUBLICATIONS

Written Opinion dated May 22, 2017 in corresponding Singapore Application No. 10201500144P, 5 pages.

* cited by examiner

*Primary Examiner* — David M Gray
*Assistant Examiner* — Michael Harrison
(74) *Attorney, Agent, or Firm* — Lewis Roca Rothgerber Christie LLP (57) ABSTRACT

A contact tip for a sequential test of electronic components comprises a base material and a hard material, wherein the base material and the hard material are fixed to each other and wherein the hard material has a thickness of at least 0.03 mm. The contact tip may be the contact tip of a contact element used for a sequential test of electronic components. A method of producing a contact tip of a contact element used for a sequential test of electronic components, comprises: Providing a plate made up of a base material and a hard material, wherein the base material and the hard material are fixed to each other; Cutting the plate along a cut line to form the contact tip wherein the cut line runs through the base material and the hard material and wherein the hard material has a thickness of at least 0.03 mm in a section where the cut line cuts the hard material.

7 Claims, 8 Drawing Sheets

CONTACT TIP AND CONTACT ELEMENT AND METHOD OF PRODUCING THE SAME

CROSS REFERENCE TO RELATED APPLICATION

This application claims the benefit of the filing date of the European patent EP 14150596 filed 9 Jan. 2014, the disclosure of which is hereby incorporated herein by reference.

FIELD OF THE INVENTION

An embodiment of the invention relates to a method of producing a contact tip and a method of producing a contact element. Further, an embodiment of the invention relates a contact tip and a contact element both being used for a sequential test of electronic components.

BACKGROUND OF THE INVENTION

Automated test equipment (ATE) must test hundreds of thousands of electronic components, ICs or DUTs (device under test) in one test period. The test is always an electronic test. Therefore it is necessary that good contacting for every DUTs is given for the whole test period. Contact tips of contact elements which are integrated in contact sockets make the contact to the terminals of the DUT. During a lot of sequential tests the contact tips may wear down or become soiled so that good contacting of the DUT is no more given. As a consequence, contact tips have been coated with hard material which is more durable against abrasion and which keeps clean for many test cycles. A problem is that the thin hard material coating (usually less than 0.01 mm) tends to wear down or to peel off the contact tip. As a consequence the cost for maintenance and spare parts is high and the positive effects are diminished when using hard material coating.

US 2013/0222005 A1 discloses a contact pin in which a carbon film is formed on a base material, e.g. by a sputtering method, with a tip divided. Sn adherence can be reduced as much as possible to be able to maintain stable electrical contact over a long period of time. The contact probe pin includes a tip divided into two or more projections and repeatedly coming into contact with a test surface at the projection. A carbon film containing a metal element is formed at least on the surface of the projection, and a radius of curvature at an apex part of the projection is 30 μm or more.

OBJECT AND SUMMARY OF THE INVENTION

There may be a need to reduce the cost for maintenance of contact sockets and there may be a need to make contact tips of contact elements more durable.

In order to meet the need defined above, a contact tip, a contact element, a method of producing a contact tip, and a method of producing a contact element are provided according to the claims 1 to 15.

According to an embodiment of the invention a method of producing a contact tip of a contact element used for a sequential test of electronic components, comprises:
Providing a plate made up of or comprising a base material and a hard material, wherein the base material and the hard material are fixed to each other;
Cutting the plate along a cut line to form the contact tip wherein
the cut line runs through the base material and the hard material and wherein
the hard material has a (minimal) thickness of at least 0.03 mm in a section where the cut line cuts the hard material.

According to another embodiment, a method of producing a contact element comprises the method of producing the contact tip, and comprises furthermore:
Cutting the plate along a cut line through the base material to form the contact element.

According to an embodiment of the invention a contact tip for a sequential test of electronic components comprises a base material, in particular a section comprising the base material, and a hard material, in particular a section comprising the hard material, wherein the base material and the hard material are fixed to each other and wherein the hard material has a thickness of at least 0.03 mm. The contact tip may be the contact tip of a contact element used for a sequential test of electronic components.

According to another embodiment a contact element comprises the contact tip and is formed from one piece wherein the base material and the hard material form the one piece.

According to another embodiment a contact element comprises the contact tip and has the shape of a contact spring. According to still another embodiment a contact element comprises the contact tip and has the shape of a pin contact. According to a further embodiment a contact element comprises the contact tip and has the shape of a rocking pin.

According to another embodiment the contact element comprising the contact tip has a transition section in particular at the region where the hard material and the base material are jointed together, wherein the transition section has a geometrical tolerance in the range of about 0.005 mm to 0.02 mm (Millimeter). By cutting the plate along the cutting line according to an embodiment of the present invention the geometry and in particular the transition section of the contact pin may be accurate. Hence the geometry, in particular the transition region between the first (base) material and the second (hard) material, fulfills e.g. required restrictions of very small tolerances, in particular of tolerances in the range of about 0.005 mm to 0.02 mm.

The base material is a first material comprising first material characteristics (e.g. composition, hardness or ductility etc.) and the hard material is a second material comprising second material characteristics (e.g. composition, hardness or ductility etc.), wherein at least one of the first material characteristics differs to a respective one of the second material characteristics. In particular, the hard material is harder than the base material.

The term "contact tip" may denote the distal end or end region of a contact element for contacting to a DUT.

The expression "sequential test" may particularly denote that a test is usually carried out with one DUT at a time. A test may be an electronic check under different environmental conditions such as defined temperature, pressure, acceleration, rotation etc. The term "electronic component" may denote a so called DUT (device under test) which is a product of the backend in the semiconductor production. Thus, the expression "sequential test of electronic components" may particularly denote an electronic examination of ICs (integrated circuits) which need a functional proof of their quality under determined conditions. The test may be carried out for one electronic component at a time and may be repeated for further electronic components (DUTs). The equipment which does the sequential test of the electronic components is usually called automated test equipment (ATE).

The expression that "a plate is made up of a base material and a hard material" may denote that the plate has two main parts, namely the base material and the hard material, which form the plate. The expression that "the base material and the hard material are fixed to each other" may denote that between the base material section of the plate and the hard material section of the plate may be further layers or means which keep the base material section and the hard material section together. Further, the hard material and the base material may be preprocessed in a way so that both are fixed to each other. For example, the hard material may be sputtered on the base material or into a hole of the base material. Other methods to fix the base material and the hard material to each other may be inserting, inlaying, pressing, and sticking, soldering, including hard soldering, welding, including laser welding, electric resistance welding, and inductive welding. After the hard material is fixed to the base material both may be grinded, and polished, so that an even surface is given. The base material and the hard material may both form a plate, wherein the hard material may have a rectangular, a circular, or any other shape. A plate consisting of the base material may be processed for getting the respective hole or pocket. The method may be milling or eroding the base material.

The term "cutting" may denote any method of cutting like wire-cut EDM (electrical discharge machining), die-sink EDM, laser cutting, and water cutting. In particular, the contact tip and/or the contact element may be cut off by etching, grinding, stamping wherein these methods may also be used partially and/or in combination.

The expression "cut line" may denote a line defining a special silhouette given on the plate and that by cutting along the cut line the special silhouette results in a special form or element. The expression "cutting the plate along a cut line" may denote a cutting process along the cut line, e.g. a silhouette given by the cut line, so that treating the plate by cutting it along the cut line results in a part or element having the patterned shape. The expression "the cut line runs through" may particularly denote that the cut line extends through the material and that the result of cutting along the cut line comprises the sections where the cut line runs. The expression "the cut line cuts to form" may denote that the pattern of the cut line on the plate results in a special form or shape after the plate is cut.

The term "base material" may denote a material having a certain elasticity and certain electrical properties (e.g. low resistance) compared to the hard material being brittle. In particular, the base material may be at least one of the group of CuBe, steel, in particular spring steel, Tungston, PaAg or any other alloys based on these materials.

The term "hard material" may denote so called carbide metals or "cemented carbide", like WC, WCCo, CrCo or any other material of this group having the required hardness and/or durability. In particular, the hard material may be at least one of the group of WC, WCCo, CrCo or any other material of this group or any other alloys based on these materials.

The term "thickness" may particularly denote a depth or extension which extends perpendicularly from the surface of a body, in particular a main surface of the body, into the body. The term "thickness" here characterizes the hard material in a direction from the surface perpendicularly into the body of the contact tip. A direction is perpendicular to a surface if it is at right angles to a given plane that touches the surface of the object tangentially. In particular, the— minimal—thickness of the hard material may be at least 0.03 mm, 0.04 mm, 0.05 mm, 0.06 mm, 0.08 mm, 0.1 mm, 0.2 mm, 0.4 mm, 0.6 mm, or 0.8 mm. Further, the maximum thickness may be 0.1 mm, 0.2 mm, 0.4 mm, 0.6 mm, 0.8 mm, or 1.0 mm. The value of the minimal thickness of the hard material is smaller than the maximal thickness of the hard material.

The expression "contact element" may denote a part of a contact socket which is usually adapted to simultaneously contact to the terminals of a DUT and to the contact portions of a DUT board. Contact elements are known in different embodiments such as contact springs, contact pins and rocking pins. Contact springs are elastic members. Contact pins are and rocking pins are usually non elastic. Contact pins are usually shifted by a spiral spring. Rocking pins are usually elastically twisted as a whole.

A gist of embodiments of the invention may be that by using the method a contact tip may be produced which results from the cut line in a geometrically exact way and which has a free to choose width. The durability of the contact tip is based on bringing the base material and the hard material together and to fix them to each other before the contact is formed. The contact tip is cut from the base material and the hard material in a section where the base material and the hard material are fixed to each other. As a consequence, the hard material has a thickness of at least 0.03 mm.

In particular, the hard material may be sputtered or plasma sprayed on the base material. Further, any adhesion layers may be used to support the fixation of the base material and the hard material to each other.

According to an exemplary embodiment of the method, a first section of the cut line runs from the base material to the hard material; wherein a second section of the cut line cuts the hard material to form a free contact tip end, wherein a third section of the cut line runs from the hard material to the base material and wherein the second section of the cut line extends between the first section and the third section.

The term "free contact tip end" may denote the section of the contact tip which is adapted to contact directly with the terminals of the DUT. Hence, the contact tip is the distal end which mostly extends parallel to a contacting direction and supports the contact force which is exerted by the free contact tip end. The free contact tip end is the absolute end section or final end section of the contact tip and may be formed as a contact blade or may end in one contact point. In particular, when cutting the second section the hard material may be cut exclusively or the hard material may be cut and a layer of the base material may be cut simultaneously.

According to an exemplary embodiment of the method, the plate is made up of or comprises the base material and a strip of the hard material being fixed to an edge of the base material and/or an edge of the plate. A strip having a straight edge and a small width may be attached or fixed to a base material plate. Forming the contact tips and contact elements may be possible along the full length of the composite plate. The base material and the hard material may be formed like key and slot, or tongue and groove, respectively. By this an abutting section between the base material and the hard material may be enlarged so that fixing of both to each other may be more durable.

According to an exemplary embodiment of the method, the plate is made up of or comprises the base material and an inlay of the hard material being fixed in a hole of the base material. The base material plate may have holes or through holes. In this hole an inlay made of the hard material may be inserted.

According to an exemplary embodiment of the method, the plate comprises a pocket in the base material, wherein the pocket is filled with the hard material.

The term "pocket" may particularly denote a recess in the base material having an appropriate size (area and depth). In particular, the method of filling the pocket with hard material may comprise plasma spraying or sputtering. The pocket may be also filled by an inlay which is (hard) soldered or brazed, welded, (dielectric) glued or bonded into the pocket.

According to an exemplary embodiment of the method, the plate comprises a further pocket on an opposite side of a main plane of the plate regarding the main plane side of the pocket, wherein the pocket and the further pocket have an overlap and wherein the further pocket is filled with a further hard material. As a consequence of the pocket overlap on both sides, a contact tip may comprise hard material on the lateral sides so that stressing of the contact tip is usually guided to at least one of the lateral hard material sides. Therefore, the contact tip is highly stress resistant.

The pockets or holes of the base material may have flanges which are rounded, perpendicular, or may have odd angles. The inlays within the pockets or holes may fit in and may have outlines which are rectangular, rounded like a circle, or may have any other outlines. There may be pockets on both sides of the base plate so that two inlays may be used on opposite sides of the base plate.

According to an exemplary embodiment of the contact tip, a first section of an edge comprises a transition of the section of the base material to the section of the hard material; wherein a second section of an edge comprises the hard material and forms a free contact tip end, wherein a third section of an edge comprises a transition of the section of the hard material to the section of the base material and wherein the second section of the edge extends between the first section and the third section of the edge.

Cutting the plate along the cut line may result in a contact tip having the shape or the edge line corresponding to the cut line. The cut line on the plate may be identical to the edge or edge line of the contact tip. The free contact tip end may therefore extend between the first section of the edge and the third section of the edge. In the first and third section the cut line runs between the base material and the hard material and hence the first and the third edge comprise a transition between the base material and the hard material.

According to an exemplary embodiment of the contact tip, the hard material extends through a width of the contact tip.

A contact tip being produced by using a strip or an inlay made of a hard material having the identical thickness like the base material results in a contact tip for which the width is given by the base material or the hard material. The strip and the inlay may be formed like a key and the base material edge may be formed as the opposite slot or complementary slot to the key, and vice versa.

According to an exemplary embodiment of the contact tip, a width of the contact tip is made up of the hard material and the base material.

A contact tip being produced by using a pocket may result in a contact tip for which the width is given by the hard material and the base material. According to the method of producing the contact tip the entire width may be made up of the hard material exclusively or the entire width may be made up of the hard material and the base material. The entire width may here be defined on the basis that any coatings like adhesion coatings or further contact coatings are neglected.

According to an exemplary embodiment of the contact tip, a width of the contact tip is made up of the hard material, the base material and a further hard material.

A contact tip being produced or formed by the pocket and an opposing further pocket may result in a contact tip for which the width is given by the hard material and a further hard material with the base material between. This may have the advantage that the contact tip is laterally on both sides made of hard material so that an abrasion which happens on the sides is reduced by the hard material. The further hard material may have a thickness of at least 0.03, 0.04, 0.05, or 0.06 mm.

SHORT DESCRIPTION OF THE DRAWINGS

In the drawings the figures show.

DETAILED DESCRIPTION OF THE DRAWINGS

Figure 1A:
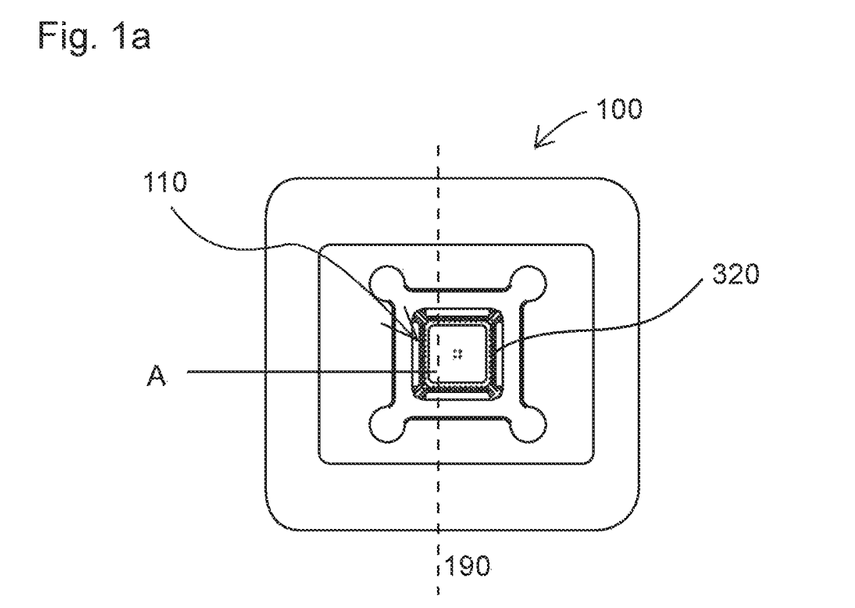
FIG. 1a a top view of a contact socket
FIG. 1b a sectional view of the socket
FIG. 2a a perspective view of a plate with pockets
FIG. 2b a perspective view of one pocket
FIG. 2c a perspective view of a plate with filled pockets
FIG. 2d a sectional view of a pocket with perpendicular flanges
FIG. 2e a plan view of a section of the plate with cut lines
FIG. 3a a perspective view of a contact spring
FIG. 3b a perspective view of a contact tip
FIG. 4a a perspective view of a plate with holes and a strip
FIG. 4b a plan view of a section of the plate with a strip and filled holes
FIG. 4c a sectional view of an inlay with perpendicular flanges
FIG. 5a a perspective view of a contact pin
FIG. 5b a perspective view of a contact spring
FIG. 5c a perspective view of a contact tip
FIG. 5d a side view of a rocking pin
FIG. 6a a perspective view of a plate with two opposing pockets
FIG. 6b a perspective view of the two opposing pockets
FIG. 6c a sectional view of the two opposing pockets
FIG. 6d a sectional view of the two opposing pockets having round flanges
FIG. 7a a perspective view of a contact spring
FIG. 7b a perspective view of a contact tip
FIG. 8 a process steps of a method of producing a contact tip

FIG. 1a shows a top view of a (simplified) contact socket 100. The top view of the socket 100 is the side of the contact site 110 where electronic components or DUTs (device under test) are pressed to be tested. The contact tips 320 are aligned laterally so that terminals of the DUT which are also located laterally are contactable. In FIG. 1a a cross section A is shown limited by the limitation line 190.

Figure 1B:
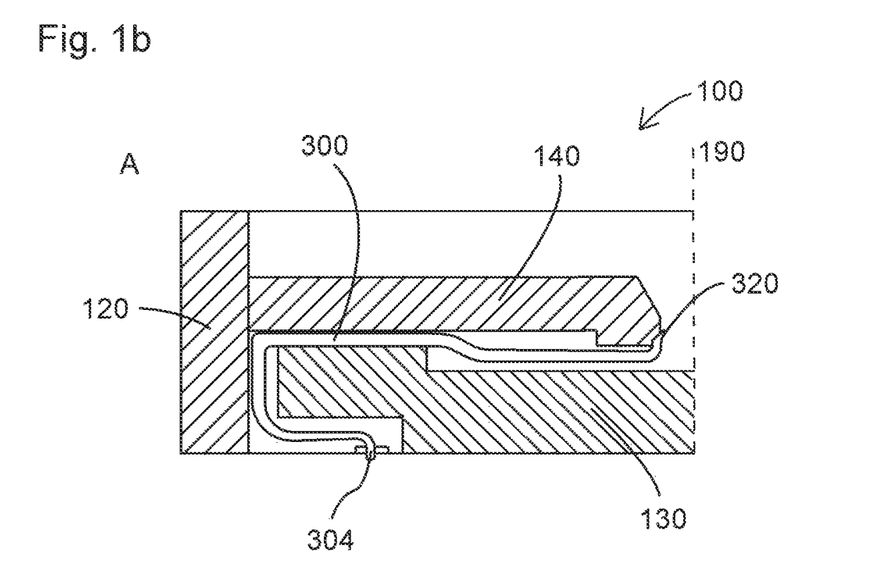

FIG. 1b shows sectional view A of the socket 100 limited by limitation line 190 also depicted in FIG. 1a. A contact spring 300 is clamped between a socket frame 120, a socket base 130 and a guiding frame 140. Flanges of the guiding frame 140 also guide the DUTs towards the contact tips 320 and the guiding frame 140 limits the movement of the contact spring 300 towards the top of the contact socket 100.

On opposite distal ends of the contact spring are the contact tip 320 and the tester sided contact tips 304 which contact to a DUT board (not shown).

FIG. 1*a* and FIG. 1*b* show the environment in which a contact element formed as a contact spring 300 is mounted.

Figure 2A:
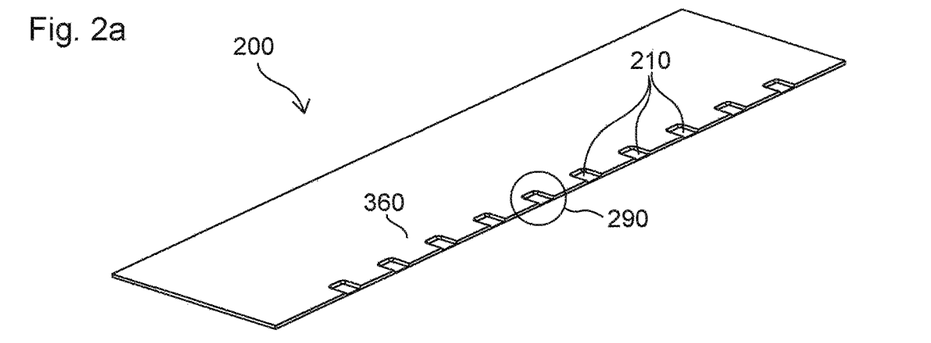

FIG. 2*a* shows a perspective view of a plate 200 with pockets 210 encircled to depict one pocket region 290. The basis of the plate 200 is made of a base material 360. The pockets 210 are positioned along an edge of the plate 200.

Figure 2B:
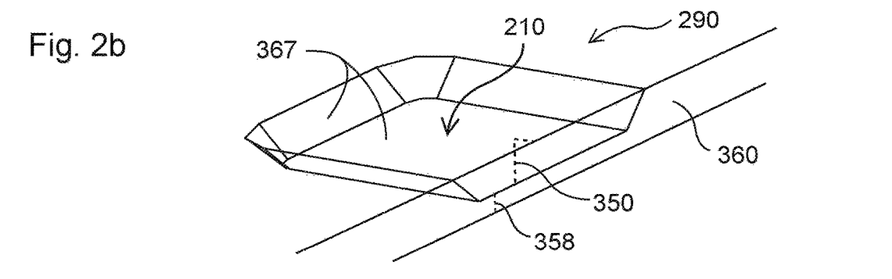

FIG. 2*b* shows a perspective view of one pocket 210 within the pocket section 290 in more detail. The pocket 210 comprises a defined pocket depth 350 and is surrounded by abutting surface 367. The base material 360 has a reduced base material thickness 358 in the under area of the pocket 210. The base material 360 surrounds the pocket 210.

Figure 2C:
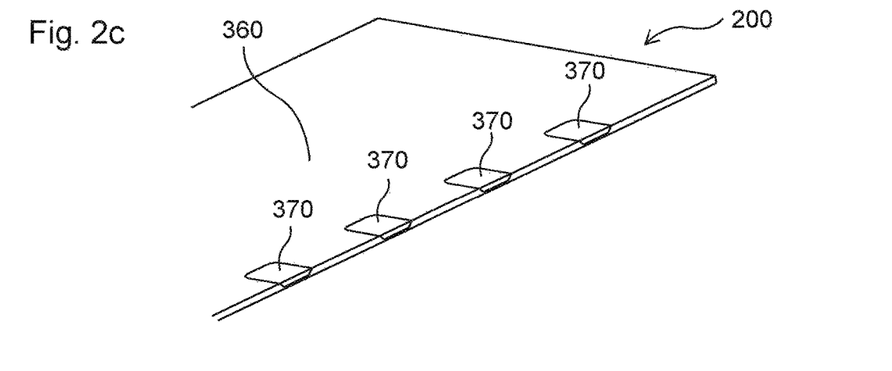

FIG. 2*c* shows perspective view of the plate 200 with filled pockets 210. The pockets 210 filled with hard material 370 are positioned along the edge of the plate 200.

Figure 2D:
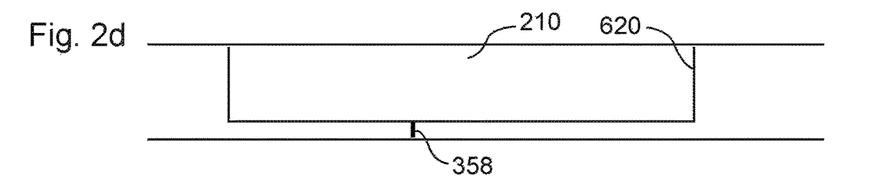

FIG. 2*d* shows a sectional view of a pocket 210 which is filled with hard material 370 wherein the flanges 620 of the pocket 210 are perpendicular. The pocket 210 may be round like a circle or may have other shapes. The base material 360 has a reduced base material thickness 358 below the pocket 210 which could also be called rest thickness.

Figure 2E:
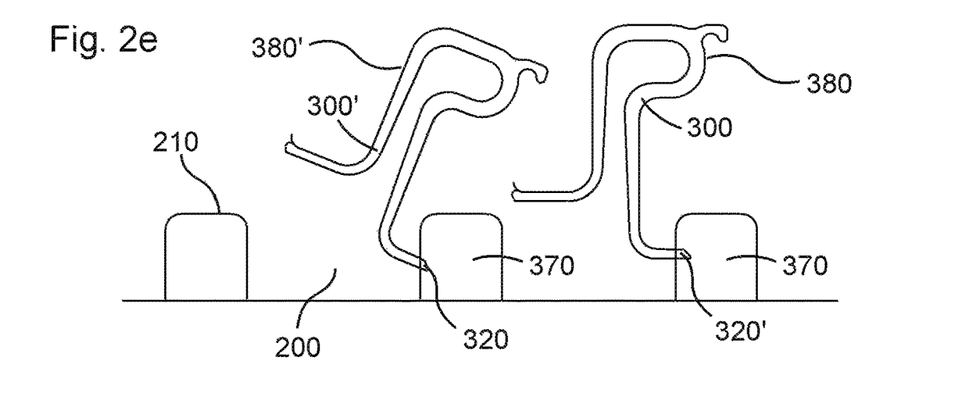

FIG. 2*e* shows a plan view of a section of the plate 200 with cut lines 380, 380'. For one pocket 210 no cut line is depicted. A cut line may have an arbitrary shape. The right cut line 380 shows the outline of a contact spring 300. The right cut line 380 is arranged in a rectangular orientation in relation to the plate 200. For example, an end portion of the contact spring 300 including the contact tip 320 may extend along a longitudinal axis which is substantially perpendicular to a border or flange of the pocket 370. The right cut line 380 crosses the border to the hard material 370 so that the contact tip 320 is within the section of the hard material 370. The left cut line 380' shows an outline of a contact spring 300' with a non-rectangular orientation so that the contact tip 320' of the left contact spring 300' differs from the contact tip 320 of the contact spring 300. For example, an end portion of the contact spring 300' including the contact tip 320' may extend along a longitudinal axis which is non-perpendicular perpendicular to a border or flange of the pocket 370.

Figure 3A:
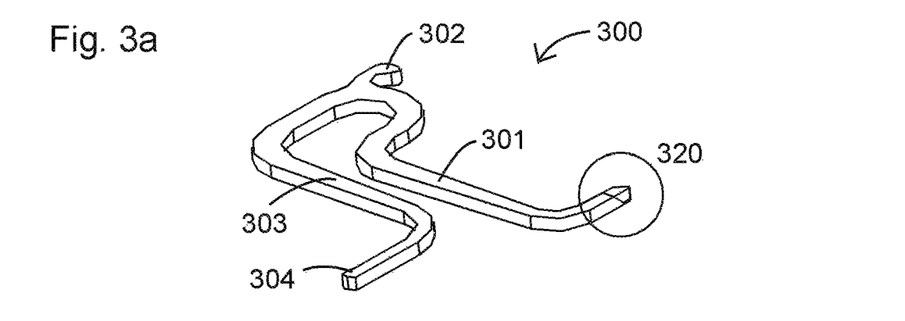

FIG. 3*a* shows a perspective view of the contact spring 300 with a typical "S"-form which extends from the tester sided contact tip 304, the (optional) clamping section 303, and the spring section 301 towards the distal end, the contact tip 320. The tester sided contact tip 304 and the contact tip 320 are both the opposite lying distal ends of the contact spring 300. A mounting pin 302 is located between the spring section 301 and the clamping section 303.

Figure 3B:
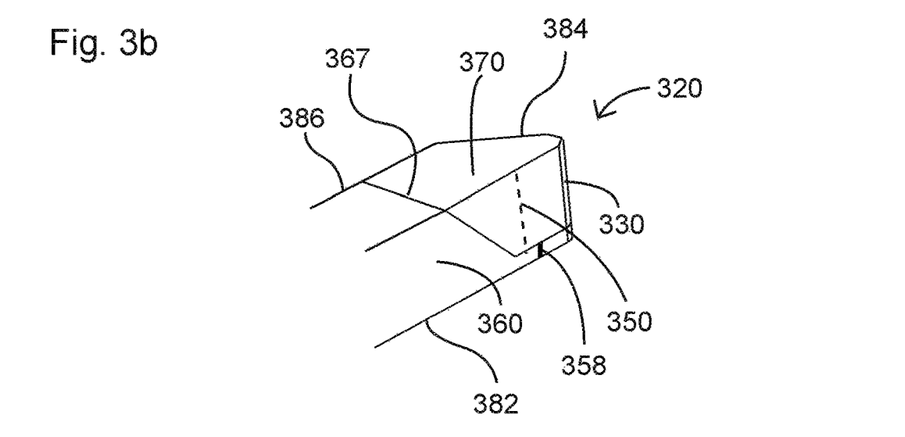

FIG. 3*b* shows a perspective view of the contact tip 320. The contact tip 320 comprises a base material 360 and a hard material 370. A first section 382 of an edge comprises the base material 360 and extends towards the free contact tip end 330. Since the contact tip 320 is partially cut off the pocket 210 (see FIG. 2*e*) the free contact tip end 330 is made of the hard material 370 and a layer of the base material 360. The thickness 350 of the hard material 370 is bigger than the base material thickness 358 so that contacting of a DUT mainly stresses the hard material part of the contact tip 320. A second section 384 following the first section 382 makes a U-turn and comprises the free contact tip end 330. Starting from the first section 382 the second section 384 ends up in a third section 386 of the edge which comprises the base material 360. The first section 382 and the third section 386 run parallel and are set forward to a bending before the spring section 301 of the contact spring 300 follows. The shape of the abutting surface 367 between the base material 360 and the hard material 370 depends on the shape and orientation of the spring 380', and the size of the pocket 210 (cf. FIG. 2*b*).

Figure 4A:
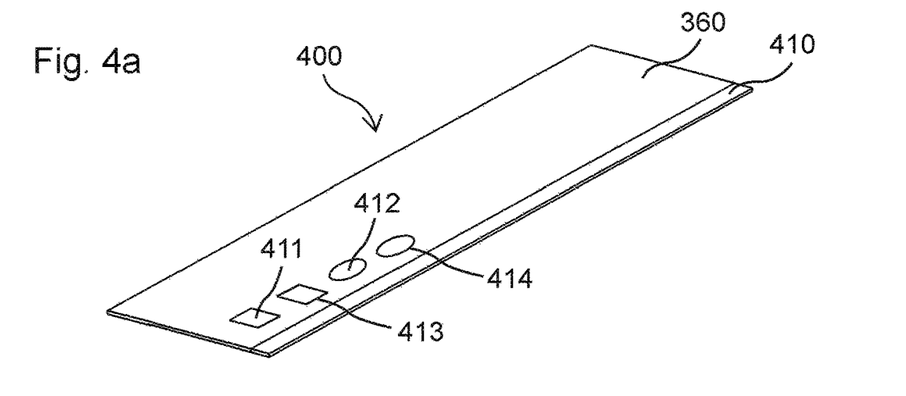

FIG. 4*a* shows a perspective view of a plate 400 with a rectangular hole 411 and a rounded hole 412 which are filled by a rectangular inlay 413 and a rounded inlay 414, respectively, both inlays consisting of hard material 370. Attached to the edge of the base material 360 is a strip 410 of hard material 370, so that the strip 410 is fixed to the base material 360. The rectangular inlay 413, the round inlay 412, 414, and the strip 410 have the same thickness like the base material 360 so that an flush and rigid plate 400 is given.

Figure 4B:
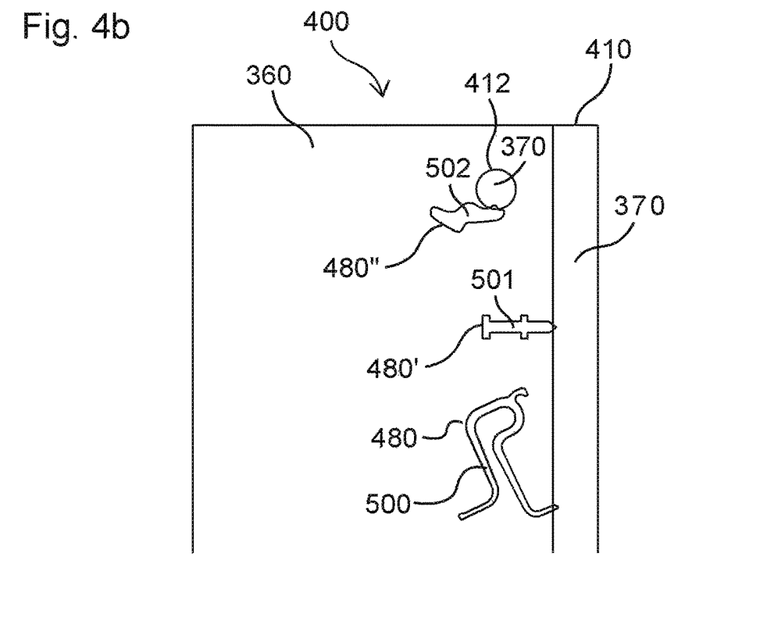

FIG. 4*b* shows a plan view of a section of the plate 400 with cut lines 480, 480', and 480". Every cut line 480, 480', and 480" crosses the transition between the base material 360 and the hard material 370. The cut line 480 forms the outline of a contact spring 500 and the cut line 480' forms the outline of a contact pin 501. Both cut lines 480, 480' extend to the strip 410 which is made of the hard material 370. The cut line 480" forms the outline of a rocking pin 502 and extends into the section of the round inlay 412 made of hard material 370.

Figure 4C:
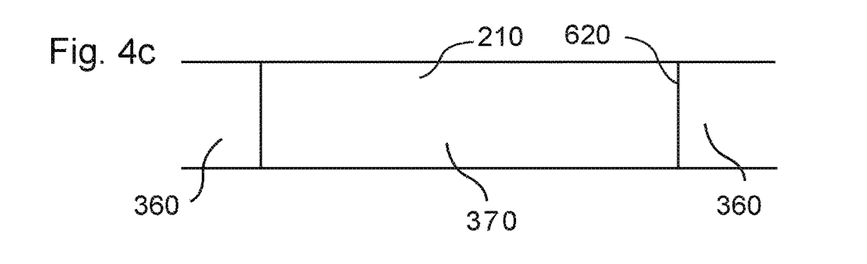

FIG. 4*c* shows a sectional view of a rounded hole 412 having perpendicular flanges 620. The rounded hole 412 is filled with an inlay 413 of hard material 370 so that the inlay 413 is surrounded by the flanges 370 of the base material 360.

Figure 5A:
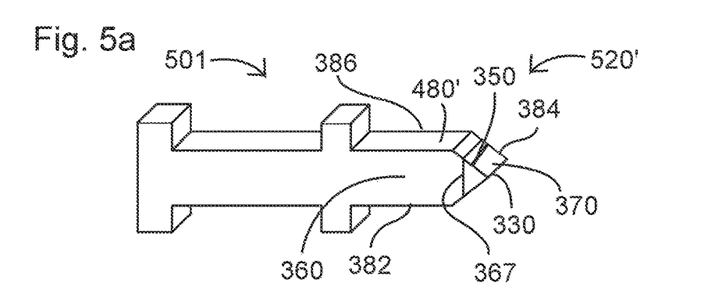

FIG. 5*a* shows a perspective view of a contact pin 501 which has been cut off the plate 400 (see FIG. 4*a* and FIG. 4*b*). The contact pin 501 has a contact tip 520' and a contact tip end 330 extending in a second section 384 of the edge between a first section 382 and a third section 386. The contact pin 501 comprises a first section 382 and a third section 386 which run parallel. A width 350 of the contact tip end 330 consists of the hard material 370, since the contact pin 501 is cut off the plate 400 along the cut line 480'. The cut line 480' results in a cut edge 480' when the contact pin 501 is singulated from the plate 400. The abutting surface 367 is the transition from the hard material 370 to the base material 360.

Figure 5B:
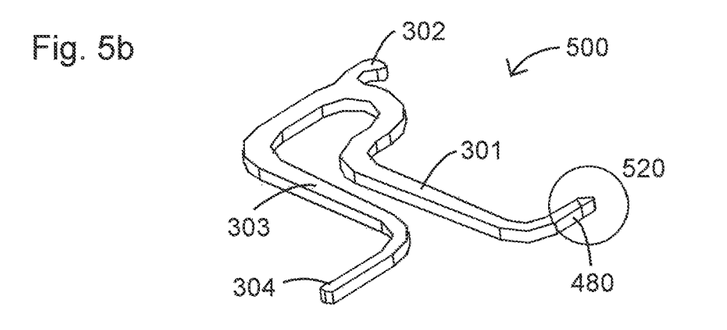

FIG. 5*b* shows a perspective view of the contact spring 500 which extends from the tester sided contact tip 304 to the contact tip 520 in a typical "S"-form, similar to the contact spring 300 of FIG. 3*a*.

Figure 5C:
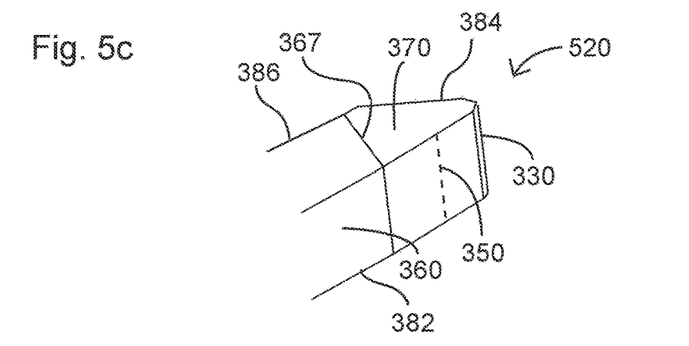

FIG. 5*c* shows a perspective view of the contact tip 520. The contact tip 520 comprises of a base material 360 and a hard material 370. A first section 382 comprises the base material 360 and extends towards the free contact tip end 330. Since the contact tip 520 is cut off the plate 400 (see FIG. 4*a* and FIG. 4*b*) the free contact tip end 330 is made of the hard material 370 only. When contacting a DUT primarily the hard material 370 part of the contact tip 320 is stressed since the width 350 of the contact tip end 330 is made exclusively of the hard material 370. The second section 384 following the first section 382 makes a "U-turn" and comprises the free contact tip end 330. Starting from the first section 382 the second section 384 ends up in a third section 386 which basically consists of base material 360. The first section 382 and the third section 386 run parallel and extend to a bending before the spring section 301 of the contact spring 300 follows. The abutting surface 367 between the base material 360 and the hard material 370 depends on the shape and the size of the inlay 411, 412 or the strip 410, respectively.

Figure 5D:
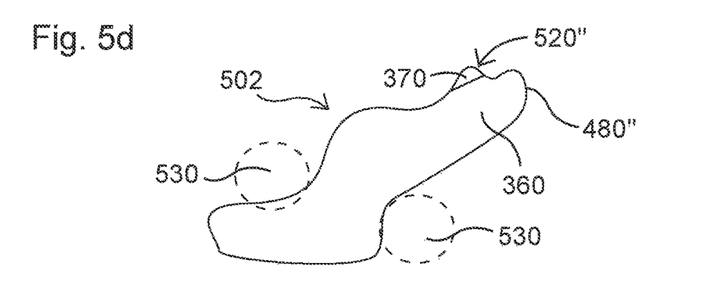

FIG. 5d shows the result of cutting the plate 400 along the cut line 480". The cut line 480" is equivalent to the outer edge of the rocking pin 502. The rocking pin 502 is made of the base material 360 and the hard material 370 in which area a DUT will be contacted. The resilient members 530 show that the rocking pin 502 may be twisted in order to elastically contact with the section of the hard material 370 to terminal of a DUT.

Figure 6A:
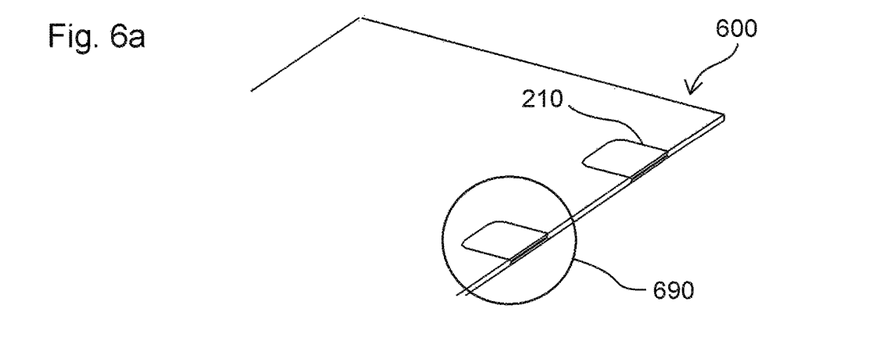
Figure 6B:
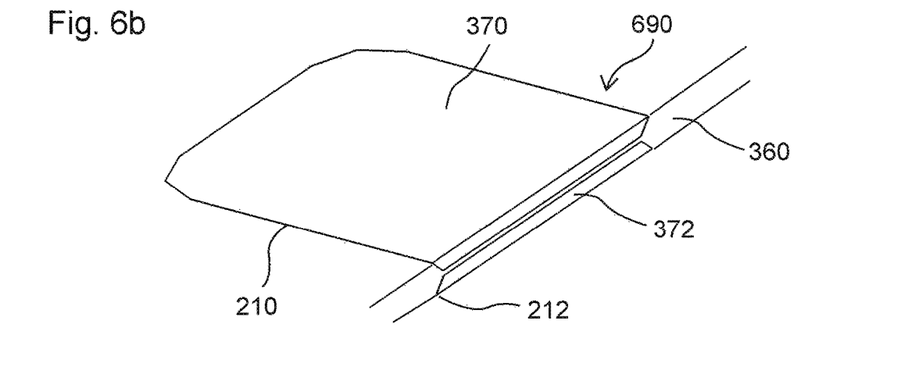
Figure 6C:
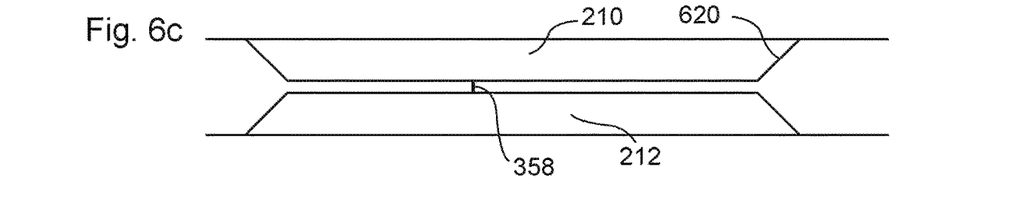

FIG. 6a shows a perspective view of a plate 600 with pockets 210 encircled to depict one pocket region 690. As can be seen in FIG. 6b the plate 600 is made of the base material 360 and a pocket 210 filled with hard material 370 on one side of the plate 600 and a further pocket 212 filled with a further hard material 372 on the other side. The pocket 210 and the further pocket 212 completely overlap. As can be seen in FIG. 6c the pocket 210 and the further pocket are distanced from each other only separated by a small slice of base material 360. So the hard material 370 and the further hard material 372 may be chosen different, since two different production steps are used to fill the pocket 210 and the further pocket 212. On the other hand, the hard material 210 and the further hard material 372 may also be identical materials.

FIG. 6c shows that the pockets 210 and 212 may have straight flanges and a corner edge at the bottom of the pockets 210 and 212.

Figure 6D:
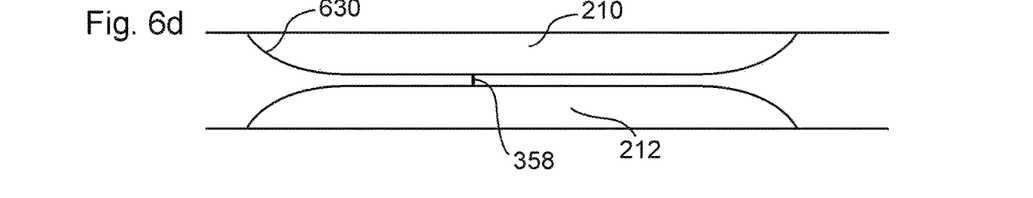

As can be seen in FIG. 6d, the pockets 210 and 212 may comprise rounded flanges 630. This may end up in different abutting surfaces (cf. ref. sign 367 in FIG. 7b).

Figure 7A:
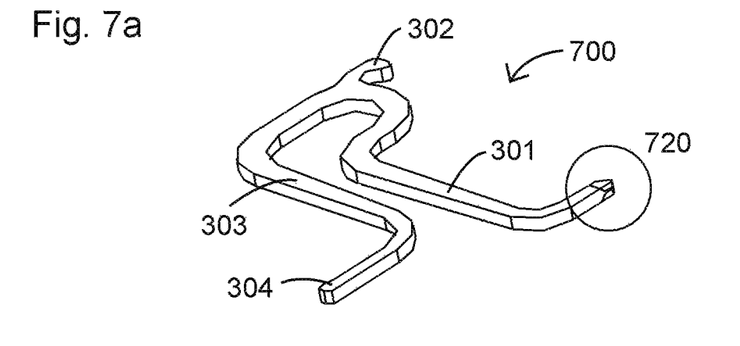

FIG. 7a shows (similar to the contact springs 300 and 500 in FIG. 3a and FIG. 5b, respectively) a contact spring 700 having the (optional) clamping section 303, a mounting pin 302, and the spring section 301 located between the distal ends, the contact tip 720 and the tester sided contact tip 304.

Figure 7B:
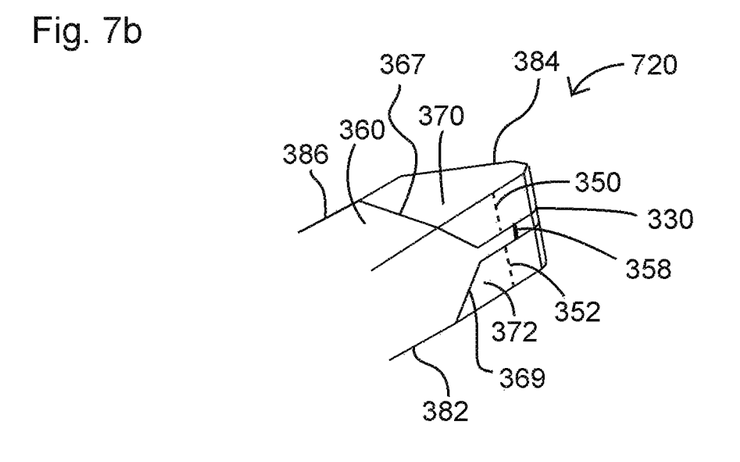

FIG. 7b shows the contact tip 720 comprising a contact tip end 330 made of a hard material 370 and a further hard material 372 with the base material 360 between. The hard material 370 has a width 350 and the further hard material 372 has a further width 352. The hard material 370 and the further hard material 372 are separated by a layer of base material 360 having a certain but small thickness 358. The first section 382 and the third section run parallel in the base material 360. The second section 384 which forms the contact tip end 330 is located between the first section 382 and the third section 386. As already mentioned the abutting surface 367 of the hard material 370 and the abutting surface 369 of the further hard material 372 depend on the form of the flanges of the pockets 210 and 212, respectively (see FIG. 6c).

Figure 8:
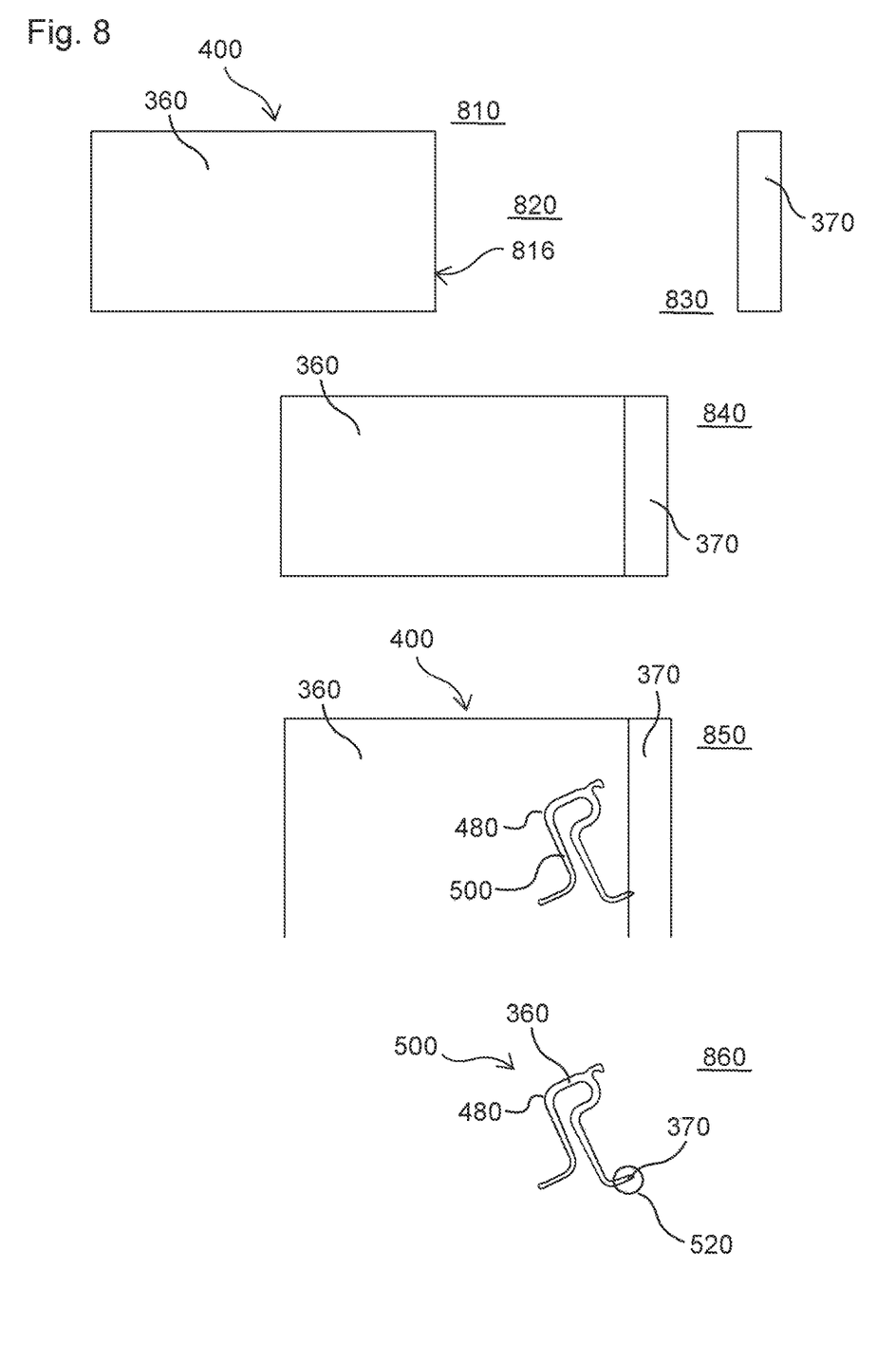

FIG. 8 shows process steps of a method of producing the contact tip 520 which comprises:

A step 810 of providing a plate 400 made up of or comprising a base material 360

A step 820 (optional) of coating the base material with an adhesion layer 816

A step 830 of providing a hard material 370

A step of fixing 840 the hard material 370 and the base material 360 to each other.

A further step 850 of cutting the plate 400 along a cut line 480 which has the outline or silhouette of the contact spring 500. The cut line 480 comprises a transition between the base material 360 and the hard material 370.

A step 860 of singulating or picking off the contact spring 500 from the plate 400 so that the contact spring 500 can be used accordingly. As a consequence, the contact spring 500 comprises a portion which is made of base material 360 and a portion which is made of the hard material 370.

The invention claimed is:

1. A method of producing a contact tip of a contact element used for a sequential test of electronic components, comprising:
   providing a plate made up of a base material and a hard material,
   wherein the base material and the hard material are fixed to each other; and
   cutting the plate along a cut line to form the contact tip;
   wherein the cut line runs through the base material and the hard material; and
   wherein the hard material has a thickness of at least 0.03 mm in a section where the cut line cuts the hard material.

2. The method of producing a contact tip according to claim 1,
   wherein a first section of the cut line runs from the base material to the hard material;
   wherein a second section of the cut line cuts the hard material to form a free contact tip end;
   wherein a third section of the cut line runs from the hard material to the base material; and
   wherein the second section of the cut line extends between the first section and the third section.

3. The method of producing a contact tip according to claim 1, wherein the plate is made up of the base material and a strip of the hard material being fixed to an edge of the base material.

4. The method of producing a contact tip according to claim 1, wherein the plate is made up of the base material and an inlay of the hard material being fixed in a through hole of the base material.

5. The method of producing a contact tip according to claim 1, wherein the plate comprises a pocket in the base material, and wherein the pocket is filled with the hard material.

6. The method of producing a contact tip according to claim 5, wherein the plate comprises a further pocket on an opposite side of a main plane of the plate regarding the main plane side of the pocket;
   wherein the pocket and the further pocket have an overlap; and
   wherein the further pocket is filled with a further hard material.

7. The method of producing a contact element according to claim 1, further comprising cutting the plate along a cut line through the base material to form the contact element.

* * * * *